United States Patent [19]

Hada

[11] Patent Number: 4,758,872
[45] Date of Patent: Jul. 19, 1988

[54] INTEGRATED CIRCUIT FABRICATED IN A SEMICONDUCTOR SUBSTRATE

[75] Inventor: Takashi Hada, Tokyo, Japan

[73] Assignee: NEC Corporation, Tokyo, Japan

[21] Appl. No.: 790,669

[22] Filed: Oct. 23, 1985

[30] Foreign Application Priority Data

Oct. 25, 1984 [JP] Japan .................................. 59-224607
Aug. 2, 1985 [JP] Japan .................................. 60-170706

[51] Int. Cl.⁴ .......................................... H01L 27/02
[52] U.S. Cl. ........................................ 357/43; 357/40; 357/46; 357/34; 357/38; 357/50; 357/51; 357/55; 357/68; 357/86
[58] Field of Search ................. 357/40, 43, 46, 34, 357/38, 51, 55, 50, 68, 86

[56] References Cited

U.S. PATENT DOCUMENTS

4,319,257  3/1982  Beasom .................................. 357/46
4,405,933  9/1983  Avery ..................................... 357/46

Primary Examiner—Edward J. Wojciechowicz
Attorney, Agent, or Firm—Sughrue, Mion, Zinn, Macpeak, and Seas

[57] ABSTRACT

For elimination of undesired leakage current, there is disclosed an integrated circuit fabricated in a semiconductor substrate of a first conductivity type which comprises at least first and second semiconductor elements, the first semiconductor element having a first impurity region of a second conductivity type formed in a surface portion of the semiconductor substrate and a second impurity region of the first conductivity type formed in the first impurity region, wherein the second impurity region is connected to the second semiconductor element by a first conductive layer extending on an insulating layer formed on the semiconductor substrate, a junction of the semiconductor substrate and the first impurity region being located under the first conductive layer.

6 Claims, 7 Drawing Sheets

INTEGRATED CIRCUIT FABRICATED IN A SEMICONDUCTOR SUBSTRATE

BACKGROUND OF THE INVENTION

The present invention relates to a semiconductor device, and more particularly to an integrated circuit device including a lateral transistor and a diode connected between the base and emitter electrodes of the transistor.

One of the basic requirements for an integrated circuit formed in a single semiconductor substrate is the elimination of unwanted leakage current arising among plural semiconductor elements, each comprising the integrated circuit.

Figure 1:
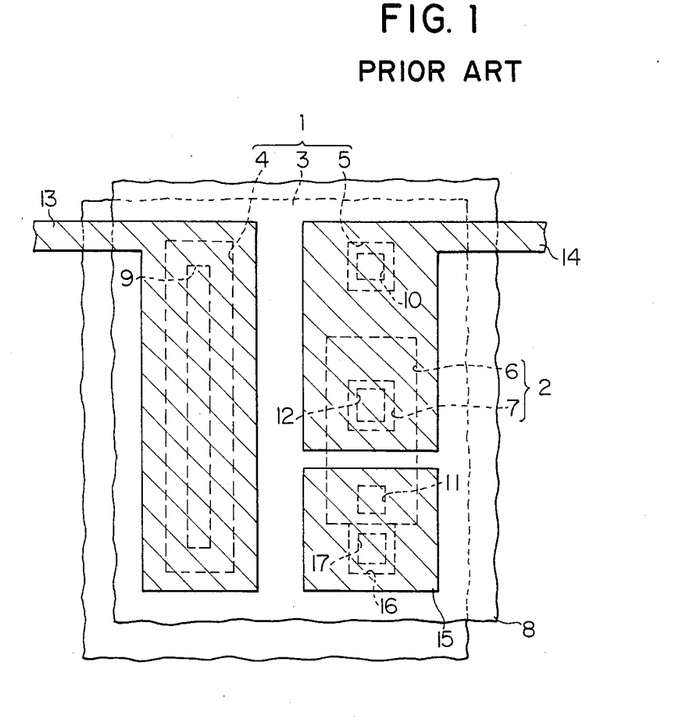
FIG. 1 is a plan view showing parts of prior-art integrated circuit.

The effect of this leakage current is explained on an example of prior-art integrated circuit construction. In FIG. 1 of the drawings reference numerals 1 and 2 designate a bipolar transistor and a diode, respectively. The bipolar transistor 1 is provided with an n-type semiconductor substrate 3, a p-type impurity region 4 formed by doping p-type impurities in the surface portion of the semiconductor substrate 3, and another p-type impurity region 5 formed by doping p-type impurities in the surface portion of the semiconductor substrate 3 which is separated by a predetermined distance from the above-mentioned impurity region 4. The impurity region 4 serves as a collector, and the impurity region 5 as an emitter, respectively.

The diode 2, on the other hand, is formed in the surface portion of the semiconductor substrate 3 distant from the bipolar transistor 1, and comprises an impurity region 6 formed by doping p-type impurites and another impurity region 7 formed by doping n-type impurities within the surface portion of the impurity region 6. The impurity regions 6 and 7 serve as an anode and a cathode of the diode 2, respectively. The surface of the semiconductor substrate 3 is covered with a silicon dioxide film 8 in which contact holes 9, 10, 11 and 12 are formed, the contact holes 9, 10, 11 and 12 being located above the impurity regions 4, 5, 6 and 7, respectively. An aluminum collector electrode 13 is in contact with the impurity region 4 through the contact hole 9. Likewise, an aluminum emitter electrode 14 is in contact with the impurity region 5 through the contact hole 10 and also with the impurity region 7 through the contact hole 12. On the other hand the impurity region 6 is in contact with a connecting electrode 15 through the contact hole 11. This connecting electrode 15 is further connected to a high concentration n-type region 16 formed in the surface portion of the substrate 3, the high concentration n-type region enhancing ohmic contact between the connecting electrode 15 and the semiconductor substrate 3.

Figure 2:
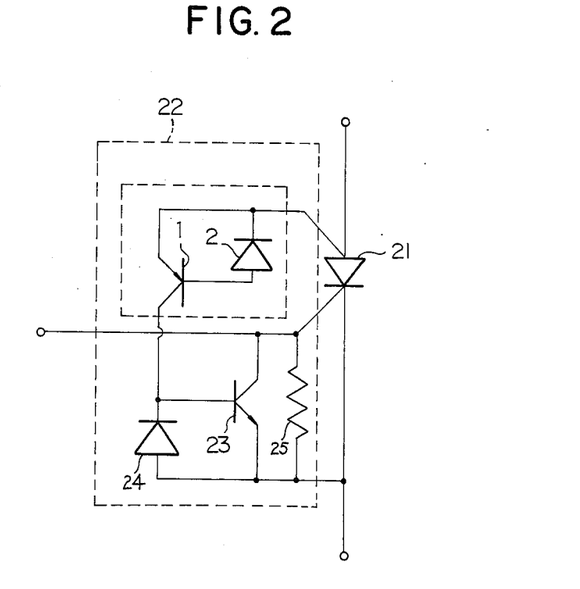
FIG. 2 is a diagram showing a protection circuit to which the present invention relates.

The bipolar transistor 1 and the diode 2 connected as described above form parts of a protection circuit which prevents a thyristor 21 shown in FIG. 2 from unwanted turning on. When a specified voltage VA is applied to the P gate of the thyristor 21 in ordinary usage, this thyristor 21 is turned on and a large current flows into the thyristor 21. If an unwanted surge voltage is applied to this thyristor 21, however, it tends to be turned on forcedly. In order to prevent the thyristor 21 from making such misoperation, the bipolar transistor 1 functions to supply a current from the N-gate electrode of the thyristor 21 to its N-base electrode by the agency of the collector capacity of the bipolar transistor 1.

The diode 2 is provided to maintain the above mentioned function of the bipolar transistor 1 by discharging to the N-gate the charges accumulated in the collector capacity of the bipolar transistor 1 when voltage fluctuation due to surge voltage is repeated. If the thyristor 21 is turned on despite of the functions of the bipolar transistor 1 and the diode 2, another bipolar transistor 23 functions to short-circuit the section between P gate and the cathode of the thyristor 21 to turn it off.

However, if a leakage current flows from the impurity region 4 to the impurity region 6, the above described function of the bipolar transistor 1 is impaired and the protection circuit 22 with the above-mentioned features fails to function correctly. For a PNP type bipolar transistor, the cause of this leakage current lies in the fact that an inversion layer is generated in the surface portion of the semiconductor substrate 3 between the impurity regions 4 and 6 due to presence of a negative voltage with respect to the semiconductor substrate 3 applied to the collector electrode 13. However, if the inversion layer reaches to the surface portion of the semiconductor substrate 3 below the emitter electrode 14, the inversion layer is extinguished by the agency of the positive voltage applied to the emitter electrode 14. In the prior-art integrated circuit the impurity region 6 is not fully covered with the emitter electrode 14 so that there is no effect of the emitter electrode 14 on the exposed surface portion of the semiconductor substratre 3. As a result the above-mentioned inversion layer can finaly attain the impurity region 6 passing through the surface portion between the emitter electrode 14 and the connecting electrode 15. This inversion layer serves as a current path, through which the leakage current is generated.

The goal of the present invention is the fabrication of an integrated circuit which is free from the leakage current due to the inversion layer generated by the potential of the electrode 13.

SUMMARY OF THE INVENTION

In accordance of the present invention there is provided an integrated circuit fabricated in a semiconductor substrate of a first conductivity type comprising at least first and second semiconductor elements, the first semiconductor element having a first impurity region of a second conductivity type formed in a surface portion of the semiconductor substrate and a second impurity region of the first conductivity type formed in the first impurity region, wherein the second impurity region is connected to the second semiconductor element by a first conductive layer extending on an insulating layer formed on the semiconductor substrate, a junction of the semiconductor substrate and the first impurity region being located under the first conductive layer. The first conductive layer may be supplied with a voltage extinguishing an inversion layer created in the semiconductor substrate thereunder. The first impurity region may be connected to the semiconductor substrate through a second conductive layer. The first impurity region may surround a particular portion of the semiconductor substrate, the first impurity region being connected to the semiconductor substrate by the second conductive layer passing through a window formed in the insulating layer, the second conductive layer covering a junction of the first impurity region and the particular portion of the semiconductor substrate surrounded thereby. The semiconductor substrate may be formed in an etched recess in a semiconductor body. The first and second semiconductor elements may be constituted by a bipolar transistor and a diode, respectively. The bipolar transistor and a diode may form part of a protection circuit for a thyristor.

BRIEF DESCRIPTION OF THE DRAWINGS

The features and advantages of an integrated circuit according to the present invention will be more clearly appreciated from the following description taken in conjunction with the accompanying drawings in which.

DETAILED DESCRIPTION OF THE INVENTION

Figure 3:
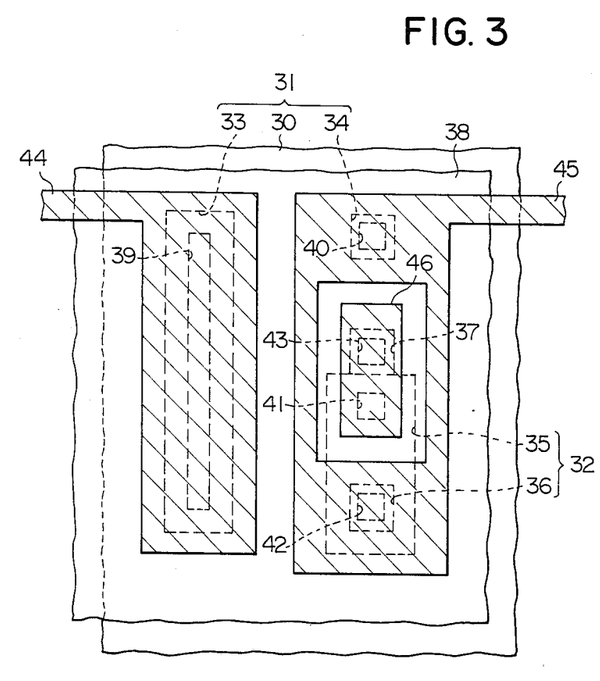
FIG. 3 is a plan view showing a first embodiment according to the present invention.
Figure 4:
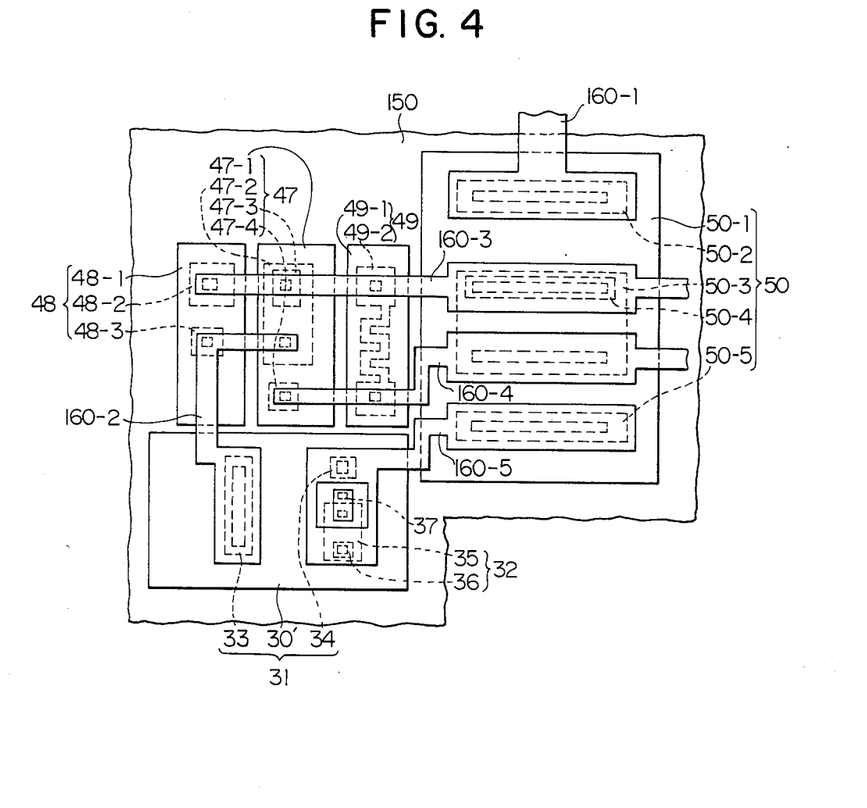
FIG. 4 is a plan view showing the protection circuit fabricated on a chip in accordance with the present invention.

In FIG. 3 of the drawings is shown the first embodiment of the present invention realized on a semiconductor substrate 30. Reference numerals 31 and 32 designate a bipolar transistor and a diode, respectively. The bipolar transistor 31 comprises the n-type semiconductor substrate 30 and two impurity regions 33 and 34 formed by doping p-type impurity atoms, for example boron atoms, in the surface portion of the semiconductor substrate 30. The substrate 30 serves as a base, while the impurity regions 33 and 34 serve as a collector and an emitter, respectively. The diode 32 comprises a p-type impurity region 35 formed in the surface portion of the semiconductor conductor substrate 30 separated by a specified distance from the impurity regions 33 and 34 and an n-type impurity region 36 provided within the p-type impurity region 35. In the surface portion of the semiconductor substrate 30 between the impurity regions 34 and 35 is located a high-concentration n-type impurity region 37 adjacent to the impurity region 35. On the surface of the semiconductor substrate 30 is grown a silicon dioxide layer 38. In respective portions of the silicon dioxide layer 38 located above the impurity regions 33, 34, 35, 36 and 37 are formed contact holes 39, 40, 41, 42 and 43 through which a collector electrode 44, an emitter electrode 45 and a connecting electrode 46 are in contact with the respective impurity region 33, 34, 35, 36 and 37. Namely, the p-type impurity region 33 keeps contact through the contact hole 39 with the collector electrode 44 indicated by hatching in FIG. 3. The emitter electrode 45 also indicated by hatching in FIG. 3 passes through the contact hole 40 to come in contact with the p-type impurity region 34, and further keeps contact with the n-type impurity region 36 through the contact hole 42. The emitter electrode 45 laid between the impurity regions 34 and 36 is branched to surround a p-n junction consisting of the semiconductor substrate 30 and the impurity region 35. Accordingly, a loop circuit is formed by the emitter electrode 45, and the p-n junction above mentioned comes to be located beneath the inner side of the outer periphery of the emitter electrode 45. Between the branched portions of the emitter electrode 45 is provided the connecting electrode 46 apart from the branched portins of the emitter electrode 45. Both ends of the connecting electrode 46 respectively pass through the contact holes 41 and 43 and keep contact with the p-type impurity region 35 and the n-type impurity region 37, respectively. Because of the above-mentioned connecting arrangement of the electrodes 44, 45 and 46, the bipolar transistor 31 and the diode 32 correspond to the prior-art transistor 1 and the diode 2 in the protection circuit 22 shown in FIG. 2 of the drawings. As shown in FIG. 4, in the semiconductor substrate 30, a bipolar transistor 47, a diode 48, a diffused resistance 49 and a thyristor 50 are further fabricated and form parts of the protection circuit shown in FIG. 2 of the drawings. The bipolar transistor 47, the diode 48, the resistor 49 and the thyristor 50 correspond to the bipolar transistor 23, the diode 24, the resistor 25 and the thyristor 21 of the protection circuit shown in FIG. 2. In FIG. 4, the thyristor 50 is composed of an n-type island region 50-1 operating as an N-gate, a p-type anode region 50-2 formed in the island region 50-1, a p-gate region 50-3 formed in the island region 50-1, an n-type cathode region 50-4 formed in the p-gate region 50-3, and an n-type contact region 50-5 of a high impurity concentration. The resistor 49 is made of an n-type island region 49-1 and a p-type resistor region 49-2 formed in the island region 49-1. The NPN bipolar transistor 47 has an n-type island region 47-1 operating as a collector, a p-type base region 47-2, an n-type emitter region 47-3 and an n+type collector contact region 47-4. The diode 48 includes an n-type island region 48-1 functioning as a cathode, a p-type anode region 48-2 formed in the cathode region 48-1 and an n+type contact region 48-3. An n-type island region 30' is provided as a base region of the lataral PNP transistor 31, and the transistor 31 and the diode 32 which have been described with reference to FIG. 3 are formed in the island region 30'. The island region 50-1, 49-1, 47-1, 48-1 and 30' are isolated from one another by an isolated region 150 with p-n junctions or dielectric layers. A plurality of interconnecting conductors 160-1 to 160-5 are formed to realize an electrical circuit shown in FIG. 2.

Turning back to FIG. 3, the function of the above-mentioned embodiment will be understood from the following description. Since a negative potential with respect to the semiconductor substrate 30 is applied to the collector electrode 44, an inversion layer is created in the surface portion of the semiconductor substrate 30 located beneath the collector electrode 44. This inversion layer tends to be extended toward the p-type impurity region 35 establishing a path through which a leakage current flows. However, the emitter electrode 45 being applied with a positive potential with respect to the substrate 30, the abovementioned inversion layer disappears below the emitter electrode 45 and never attains the p-type impurity region 35. Therefore the leakage current is interrupted and the function of the protection circuit is never impaired.

Figure 5:
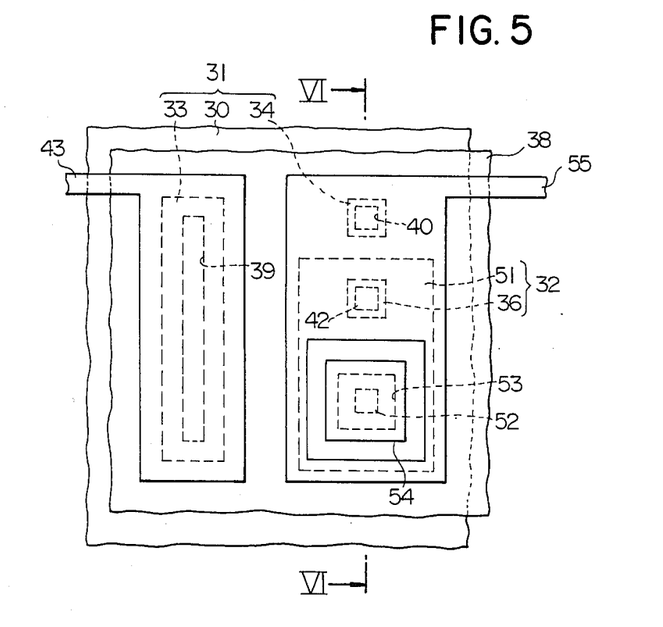
FIG. 5 is a plan view showing a second embodiment according to the present invention.
Figure 6:
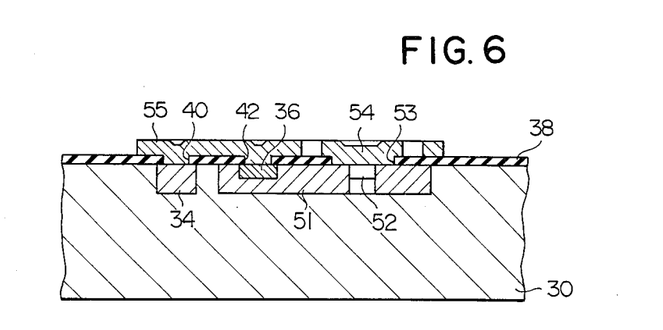
FIG. 6 is a cross sectional view of the second embodiment taken along the line VI—VI of FIG. 5.

Refering to FIGS. 5 and 6, there is shown the second embodiment in which the regions and the elements of the second embodiment are denotd by reference numerals designating the respective counterparts of the first embodiment shown in FIG. 3. In the p-type impurity region 51 forming part of the diode 32, there is formed an n-type impurity region 52 with high impurity concentration continuing to the semiconductor substrate 30 and surrounded by the p-type impurity region 51. In the silicon dioxide layer 38 is formed a contact hole 53 exposing a p-n junction consisting of the impurity regions 51 and 52. A connecting electrode 54 filling the contact hole 53 provides electrical connection between the impurity regions 51 and 52. denotd by reference numerals designating the respective counterparts of the first embodiment shown in FIG. 3. In the p-type impurity region 51 forming part of the diode 32, there is formed an n-type impurity region 52 with high impurity concentration continuing to the semiconductor substrate 30 and surrounded by the p-type impurity region 51. In the silicon dioxide layer 38 is formed a contact hole 53 exposing a p-n junction consisting of the impurity regions 51 and 52. A connecting electrode 54 filling the contact hole 53 provides electrical connection between the impurity regions 51 and 52. The connecting electrode 54, thus, arranged, the p-n junction of the impurity regions 51 and 52 is covered with the connecting electrode 54. An emitter electrode 55 extends along with a p-n junction of the impurity region 51 and the semiconductor substrate 30 covering the p-n junction. As the p-n junctions of the second embodiment is, thus, covered with the connecting electrode 54 and the emitter electrode 55, the semiconductor device shown in FIGS. 5 and 6 are free from not only the short-circuiting between the impurity regions 33 and 51 as in the case of the first embodiment, but also the contamination or influences of radiation of light from outside.

Figure 7:
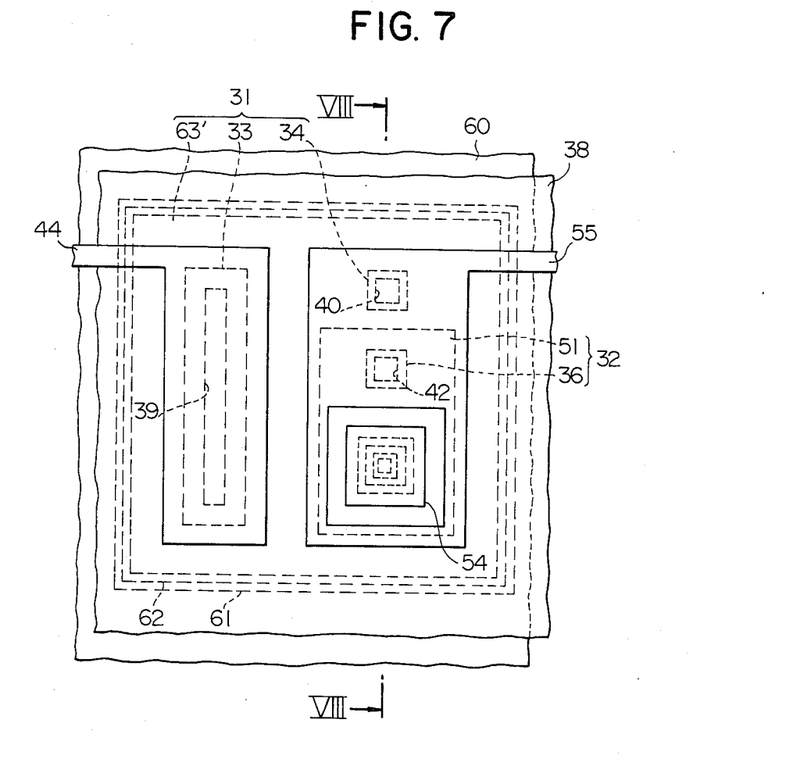
FIG. 7 is a plan view showing a third embodiment according to the present invention.
Figure 8:
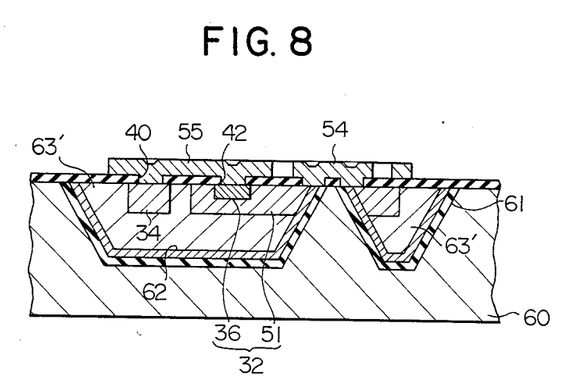
FIG. 8 is a cross sectional view of the third embodiment taken along the line VIII—VIII of FIG. 7.

Turning to FIGS. 7 and 8, the third embodiment of the present invention is shown. The same reference numerals used in FIGS. 5 and 6 designate corresponding regions and elements of the third embodiment. The device according to this embodiment has a dielectric isolation structure and are formed as follows. An n-type monocrystalline silicon substrate 63 is prepared, and V-shaped grooves are selectively formed in one side portion of the substrate. N-type impurities are thereafter introduced into the entire surface portion of the substrate having the V-shaped grooves to form an n-type high concentration layer 62. An insulating layer 61 made of silicon dioxide is deposited on the layer 62. A polycrystalline silicon layer 60 is grown on the insulating layer 61 to fill each V-shaped groove. Subsequently, the silicon substrate 63 is selectively etched away from its another side portion to expose portions of the polycrystalline silicon layer 60. As a result, the layer 60 operates as a supporting body and the substrates 63 are separated into a plurality of island active regions 63'. In FIG. 7, only one active region 63' is shown.

In the active area 63' are fabricated the bipolar transistor 31 and the diode 32 to the impurity region 51 of which is electrically connected to the impurity layer 62 through the electrode 54.

In the third embodiment, the effect of emitter electrode 55 extinguishes the inversion layer attributable to a negative potential applied to the collector electrode 44 so as to prevent the transistor 31 from the leakage current. Moreover, all the important p-n junctions are covered with the electrodes 44, 54 and 55, the integrated circuit is free from the undesirable results discussed in conjunction with the second embodiment.

As will be understood from the foregoing description, this invention is advantageous in elimination of undesirable leakage current with a resultant of maintaining the proper function of the protection circuit.

What is claimed is:

1. A semiconductor device comprising:
   a transistor provided with a base region of one conductivity type, an emitter region formed in the base region and having the opposite conductivity type to the base region, and a collector region formed in the base region and having the opposite conductivity type to the base region;
   a diode provided with a first region formed in said base region and having the same conductivity type as the emitter region and a second region formed in the first region and having the same conductivity type as the base region;
   an insulating layer covering respective surfaces of said base region, said emitter region, said collector region, said first region and said second region;
   first, second, third and fourth contact holes formed in said insulating layer and opened at one ends thereof to the surface of the insulating layer and the other ends thereof to the surfaces of said base region, emitter region, said first region and said second region, respectively;
   a first conductive layer formed on said insulating layer and connected through said second and fourth contact holes to said emitter region and said second region for providing an electric path therebetween, said first conductive layer having looped configuration to form therein an open space exposing preselected area of the surface of said insulating layer; and
   a second conductive layer formed on said insulating layer and connected through said first first and third contact holes to said base region and said first region for providing an electric path therebetween, said second conductive layer being located in the preselected area in said open space formed in said first conductive layer, wherein a p-n junction between said base region and said first region is arranged to be located below the inside of the outer peripheral of said first conductive layer.

2. A semiconductor device as set forth in claim 1, in which said semiconductor device further comprises a fifth contact hole formed in said insulating layer and opened at one end thereof to the surface of said insulating layer and at the other end thereof to the surface of said collector region and a third conductive layer formed on the insulating layer and connected through the fifth contact hole to the collector region, and in which said first conductive layer is supplied with a certain voltage level operative to increase an impurity concentration of said one conductivity type in the surface portion of the base region, thereby blocking a leakage current path between said collector region and said first region.

3. A semiconductor device comprising: a first region of one conductivity type; second, third and fourth regions having the opposite conductivity type to said first region and formed in said first region, said second, third and fourth regions being spaced apart from one another; a fifth region of said one conductivity type formed in said fourth region; an insulating layer covering surfaces of said first to fifth regions and provided with first, second, third, fourth and fifth contact holes opened at one ends thereof to the surface of the insulating layer and at the other ends thereof to the respective surfaces of the first, second, third, fourth and fifth regions; a first conductive layer formed on said insulating layer and connected through said second and fifth contact holes to said second and fifth regions, respectively, said first conductive layer having an open space exposing a preselected area of the surface of said insulating layer, said first conductive layer further having an outer peripheral located over an outer area of p-n junction between the first and fourth regions; a second conductive layer formed on the preselected area of said insulating layer and connected through said first and fourth contact holes to said first and fourth regions; and a third conductive layer formed on said insulating layer and connected through said third contact hole to said third region, wherein said first conductive layer is conductive to preventing said first region from production of a leakage current path between said third and fourth regions.

4. A semiconductor device comprising:
   (a) a transistor provided with a base region, emitter region formed in a surface portion of the base region and a collector region formed in the surface portion of the base region;
   (b) a diode provided with a looped region formed in the surface portion of said base region and having the same conductivity type as said emitter region and an impurity region formed in the looped region and having the same conductivity type as said base region, said looped region surrounding a preselected area of the surface portion of said base region;
   (c) an insulating layer covering surfaces of said base region, said emitter region, said collector region, said looped region and said impurity region;
   (d) first and second contact holes formed in said insulating layer and exposing parts of the respective surfaces of said emitter region and said impurity region, respectively;
   (e) a third contact hole formed in said insulating layer and exposing a part of said looped region and the preselected area of the surface portion of said base region;
   (f) a first conductive layer contacting with the parts of the respective surfaces of said emitter region and said impurity region through said first and second contact holes, respectively, and extending on said insulating layer in such a manner as to be located over the outer peripheral of said looped region for shielding the outer peripheral of the looped region, said first conductive layer having an open space exposing a preselected area of said insulating layer; and
   (g) a second conductive layer contacting with the part of said looped region and the preselected area of the surface portion of said base region through said third contact hole and located on the preselected area of said insulating layer.

5. A semiconductor device as set forth in claim 17, in which said semiconductor device further comprises a fourth contact hole exposing a part of the surface of said collector region and a third conductive layer contacting with the part of the surface of the collector region through the fourth contact hole, and in which said first conductive layer is supplied with a voltage level operative to increase a carrier concentration in the surface portion of said base region for preventing said base region from generation of a leakage current path between said collector region and said looped region.

6. A semiconductor device comprising:
   a first transistor provided with a base region of one conductivity type, an emitter region formed in the base region and having the opposite conductivity type to the base region, and a collector region formed in the base region and having the opposite conductivity type to the base region;
   a first diode provided with a first region formed in said base region and having the same conductivity type as the emitter region and a second region formed in the first region and having the same conductivity type as the base region;
   an insulating layer covering respective surfaces of said base region, said emitter region, said collector region, said first region and said second region;
   first, second, third and fourth contact holes formed in said insulating layer and opened at one ends thereof to the surface of the insulating layer and the other ends thereof to the surfaces of said base region, emitter region, said first region and said second region, respectively;
   a first conductive layer formed on said insulating layer and connected through said second and fourth contact holes to said emitter region and said second region for providing an electric path therebetween, said first conductive layer having looped configuration to form therein an open space surrounding a preselected area of said insulating layer, a p-n junction between said base region and said first region being located below the inside of the outer peripheral of said first conductive layer;
   a second conductive layer formed on said insulating layer and connected through said first and third contact holes to said base region and said first region for providing an electric path therebetween, said second conductive layer being located in said preselected area in said open space formed in said first conductive layer;
   a thyristor having an anode, a cathode, a first gate and a second gate, said first gate being coupled to the emitter region of said first transistor and the second region of said first diode;
   a second transistor having a base region connected to the collector region of said first transistor and emitter and collector regions connected to the cathode and the second gate of said thyristor, respectively;
   a second diode having an anode and a cathode connected to the emitter region and the base region of said second transistor; and
   a resistor provided between the second gate and the cathode of said thyristor.

* * * * *